US011466656B2

(12) United States Patent
Ciaccio et al.

(10) Patent No.: US 11,466,656 B2
(45) Date of Patent: Oct. 11, 2022

(54) DUAL VOLTAGE BATTERY SYSTEM FOR A VEHICLE

(71) Applicant: Gentherm Incorporated, Northville, MI (US)

(72) Inventors: Michael Peter Ciaccio, Chelsea, MI (US); Timothy Hughes, South Lyon, MI (US)

(73) Assignee: Gentherm Incorporated, Northville, MI (US)

( * ) Notice: Subject to any disclaimer, the term of this patent is extended or adjusted under 35 U.S.C. 154(b) by 438 days.

(21) Appl. No.: 15/918,417

(22) Filed: Mar. 12, 2018

(65) Prior Publication Data

US 2018/0252774 A1    Sep. 6, 2018

Related U.S. Application Data

(63) Continuation of application No. 15/910,663, filed on Mar. 2, 2018, now Pat. No. 11,215,156.

(Continued)

(51) Int. Cl.
*B60L 58/12* (2019.01)
*F02N 11/08* (2006.01)
(Continued)

(52) U.S. Cl.
CPC ............ *F02N 11/0866* (2013.01); *B60L 1/02* (2013.01); *B60L 50/51* (2019.02); *B60L 50/66* (2019.02);
(Continued)

(58) Field of Classification Search
CPC ... Y02E 60/12; H02J 7/0047; H02J 2007/005; H02J 7/1415; H02J 7/0021; H02J 7/0054; H02J 2007/0059; H02J 2007/0067; H02J 7/0091; H02J 7/0063; G01R 31/3648; G01R 31/3651; G01R 31/3624;
(Continued)

(56) References Cited

U.S. PATENT DOCUMENTS

2005/0151513 A1    7/2005  Cook et al.
2007/0212598 A1 *  9/2007  Iida .................. H01M 10/48
                                           429/62

(Continued)

FOREIGN PATENT DOCUMENTS

EP        2535218 A1     12/2012
KR     20130003367 A      1/2013
(Continued)

OTHER PUBLICATIONS

International Search Report and Written Opinion for PCT Application No. PCT/US2018/020733 dated May 24, 2018; 16 Pages.

*Primary Examiner* — Nathaniel R Pelton

(57) ABSTRACT

A power management system for a vehicle includes a first battery monitoring module configured to monitor a first state of charge (SOC) of a first battery of the vehicle. The first battery has a first nominal voltage. A second battery monitoring module is configured to monitor a second SOC of a second battery of the vehicle. The second battery has a second nominal voltage that is greater than the first nominal voltage. A control module is configured to selectively apply power to a heater of the second battery based on an estimated value of the second SOC of the second battery at a next startup of an engine.

24 Claims, 12 Drawing Sheets

Related U.S. Application Data

(60) Provisional application No. 62/466,954, filed on Mar. 3, 2017.

(51) Int. Cl.

| | | |
|---|---|---|
| *H02J 7/00* | (2006.01) | |
| *H01M 10/44* | (2006.01) | |
| *H01M 10/615* | (2014.01) | |
| *H01M 10/625* | (2014.01) | |
| *H01M 10/635* | (2014.01) | |
| *H01M 10/6571* | (2014.01) | |
| *G01R 31/388* | (2019.01) | |
| *F02N 19/02* | (2010.01) | |
| *B60L 58/20* | (2019.01) | |
| *B60L 1/02* | (2006.01) | |
| *B60L 58/10* | (2019.01) | |
| *B60L 50/51* | (2019.01) | |
| *B60L 58/27* | (2019.01) | |
| *B60L 50/60* | (2019.01) | |
| *G01R 31/396* | (2019.01) | |
| *G01R 31/36* | (2020.01) | |
| *H01M 10/42* | (2006.01) | |
| *H02J 7/34* | (2006.01) | |
| *B60L 58/15* | (2019.01) | |
| *B60W 10/06* | (2006.01) | |
| *H02J 7/14* | (2006.01) | |
| *B60R 16/033* | (2006.01) | |

(52) U.S. Cl.
CPC .............. *B60L 58/10* (2019.02); *B60L 58/15* (2019.02); *B60L 58/20* (2019.02); *B60L 58/27* (2019.02); *B60W 10/06* (2013.01); *F02N 19/02* (2013.01); *G01R 31/3647* (2019.01); *G01R 31/388* (2019.01); *G01R 31/396* (2019.01); *H01M 10/4207* (2013.01); *H01M 10/441* (2013.01); *H01M 10/443* (2013.01); *H01M 10/615* (2015.04); *H01M 10/625* (2015.04); *H01M 10/635* (2015.04); *H01M 10/6571* (2015.04); *H02J 7/0021* (2013.01); *H02J 7/0047* (2013.01); *H02J 7/0063* (2013.01); *H02J 7/0091* (2013.01); *H02J 7/007192* (2020.01); *H02J 7/1415* (2013.01); *H02J 7/342* (2020.01); *B60L 2210/10* (2013.01); *B60L 2240/36* (2013.01); *B60L 2240/545* (2013.01); *B60L 2240/547* (2013.01); *B60L 2240/549* (2013.01); *B60L 2260/56* (2013.01); *B60R 16/033* (2013.01); *F02N 2200/061* (2013.01); *F02N 2200/064* (2013.01); *F02N 2200/122* (2013.01); *H01M 2220/20* (2013.01); *H02J 7/0025* (2020.01); *H02J 7/0048* (2020.01); *H02J 2007/0067* (2013.01); *H02J 2207/20* (2020.01); *Y02T 10/70* (2013.01); *Y02T 10/72* (2013.01)

(58) Field of Classification Search
CPC .......................... G01R 31/388; G01R 31/396; G01R 31/3647; F02N 11/0866; F02N 2200/122; F02N 2200/064; F02N 2200/061; F02N 19/02; B60W 10/06; H01M 10/443; H01M 10/6571; H01M 10/635; H01M 10/625; H01M 10/615; H01M 10/441; H01M 2220/20; H01M 10/4207; B60R 16/033; Y02T 10/7216; Y02T 10/7066; Y02T 10/7005; Y02T 10/7044; B60L 2260/56; B60L 2240/549; B60L 2240/547; B60L 2240/545; B60L 2240/36; B60L 2210/10; B60L 50/66; B60L 58/27; B60L 58/20; B60L 58/13; B60L 58/12; B60L 58/10; B60L 50/51; B60L 1/02
USPC .................................................. 320/132, 109
See application file for complete search history.

(56) References Cited

U.S. PATENT DOCUMENTS

| | | | |
|---|---|---|---|
| 2010/0030041 A1 | 2/2010 | Bruinsma et al. | |
| 2010/0300414 A1 | 12/2010 | Pursifull et al. | |
| 2012/0031672 A1 | 2/2012 | Trinh et al. | |
| 2012/0065827 A1* | 3/2012 | Kimura | B60L 58/18 903/903 |
| 2012/0316721 A1* | 12/2012 | O'Connor | B60L 7/04 701/22 |
| 2013/0003827 A1 | 1/2013 | Misra et al. | |
| 2013/0038271 A1 | 2/2013 | Park | |
| 2013/0200846 A1 | 8/2013 | Ang | |
| 2013/0342015 A1* | 12/2013 | Takano | H01M 10/443 307/38 |
| 2015/0014901 A1 | 1/2015 | Ou | |
| 2015/0026780 A1 | 1/2015 | Igarashi et al. | |
| 2015/0028391 A1 | 1/2015 | Takahashi | |
| 2015/0134231 A1* | 5/2015 | Li | F02N 11/0866 701/112 |
| 2015/0149014 A1 | 5/2015 | Kees et al. | |
| 2015/0267801 A1* | 9/2015 | Bidner | F01P 7/16 701/2 |
| 2015/0311736 A1* | 10/2015 | Park | G01R 31/382 320/103 |
| 2016/0000171 A1 | 1/2016 | Glezerman et al. | |
| 2016/0001719 A1* | 1/2016 | Frost | H02J 7/342 307/20 |
| 2016/0059733 A1* | 3/2016 | Hettrich | H04W 4/029 701/2 |
| 2017/0000841 A1 | 1/2017 | Brown et al. | |
| 2017/0008419 A1* | 1/2017 | Kim | B60L 58/15 |
| 2017/0021737 A1* | 1/2017 | Park | B60L 53/20 |
| 2017/0050631 A1* | 2/2017 | Muralidhar | B60W 10/08 |
| 2017/0133731 A1* | 5/2017 | Hermann | H01M 10/441 |
| 2017/0187316 A1* | 6/2017 | Kobayashi | H02J 7/007 |
| 2017/0217328 A1* | 8/2017 | Patel | B60K 1/04 |
| 2018/0007218 A1 | 1/2018 | Sasaki | |
| 2018/0072183 A1 | 3/2018 | Nomura | |
| 2018/0252195 A1 | 9/2018 | Ciaccio et al. | |

FOREIGN PATENT DOCUMENTS

| | | |
|---|---|---|
| WO | WO-2014011728 A2 | 1/2014 |
| WO | WO-2015044739 A1 | 4/2015 |

\* cited by examiner

DUAL VOLTAGE BATTERY SYSTEM FOR A VEHICLE

CROSS-REFERENCE TO RELATED APPLICATIONS

This application is a continuation of U.S. application Ser. No. 15/910,663, filed on Mar. 2, 2018, which claims the benefit of U.S. Provisional Application No. 62/466,954, filed on Mar. 3, 2017. The entire disclosures of the applications referenced above are incorporated herein by reference.

FIELD

The present disclosure relates to battery systems for vehicles and more particularly dual voltage battery systems for vehicles.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Vehicle battery systems are an important component of a vehicle. If the capacity of the battery is too small, the vehicle may be unable to start an engine in cold weather. If the capacity of the battery is increased, a footprint of the battery and/or the cost of the battery also typically increase. Current battery systems typically operate at 12V (Volt). For vehicles such as hybrid vehicles, there are advantages associated with moving to higher voltage battery systems such as battery systems operating at 48V. However, many of the vehicle components were designed to operate at 12V so it is difficult to switch production to the higher voltage battery system all at once. Some vehicles have a dual voltage battery system including a first battery operating at a first voltage level such as 12V and a second battery operating at a higher voltage level such as 48V.

SUMMARY

In a feature, a power management system for a vehicle is described. A first battery monitoring module is configured to monitor a first state of charge (SOC) of a first battery of the vehicle. The first battery has a first nominal voltage. A second battery monitoring module is configured to monitor a second SOC of a second battery of the vehicle. The second battery has a second nominal voltage that is greater than the first nominal voltage. A control module is configured to, using a direct current (DC) to DC converter, selectively charge the second battery with power from the first battery until the second SOC of the second battery is greater than or equal to a predetermined SOC.

In further features, a starter control module is configured to selectively apply power to a starter of an engine from the second battery.

In further features, the control module is configured to selectively charge the second battery with power from the first battery when the second SOC of the second battery at shutdown of an engine of the vehicle is less than the predetermined SOC.

In further features, the control module is configured to: determine whether to charge the second battery with power from the first battery based on an ambient temperature at shutdown of an engine; and selectively charge the second battery with power from the first battery based on the determination.

In further features, the control module is further configured to, prior to a startup of an engine of the vehicle, selectively apply power to a heater of the second battery based on a temperature of the second battery and the SOC of the second battery.

In further features, the control module is configured to, prior to the startup of the engine of the vehicle, apply power to the heater of the second battery when the temperature of the second battery is less than a predetermined temperature.

In further features, the control module is configured to, prior to the startup of the engine of the vehicle, apply power to the heater of the second battery from the first battery when: the temperature of the second battery is less than a predetermined temperature; and the second SOC of the second battery is less than the predetermined SOC.

In further features, the control module is further configured to, prior to a startup of an engine of the vehicle, using the DC to DC converter, charge the first battery with power from the second battery when the second SOC of the second battery is greater than a second predetermined SOC.

In further features, the second predetermined SOC is greater than the predetermined SOC.

In further features, the control module is configured to: in response to a shutdown of an engine of the vehicle, determine an estimated temperature at a next startup of the engine; determine whether to charge the second battery with power from the first battery based on the estimated temperature; and selectively charge the second battery with power from the first battery based on the determination.

In further features, the control module is configured to set the estimated temperature at the next startup of the engine based on an ambient temperature at the shutdown of the engine.

In further features, the control module is configured to set the estimated temperature at the next startup of the engine based on an ambient temperature obtained in response to the shutdown of the engine minus a predetermined temperature.

In further features, the control module is configured to determine the estimated temperature at the next startup of the engine based on an average temperature at a location of the vehicle at the next startup of the engine.

In further features, the control module is configured to determine the estimated temperature at the next startup of the engine based on a forecast temperature at a location of the vehicle at the next startup of the engine.

In further features, the control module is configured to determine the estimated temperature at the next startup of the engine based on a plurality of previous temperatures at previous startups of the engine performed near a location of the vehicle, respectively.

In further features, the control module is configured to determine to charge the second battery with power from the first battery when, based on the estimated temperature at the next startup of the engine, an estimated value of the second SOC of the second battery at the next startup of the engine is less than the predetermined SOC.

In further features, the control module is configured to: in response to a shutdown of an engine of the vehicle, determine an estimated temperature at a next startup of the engine; determine an ambient temperature at the next startup of the engine; and selectively apply power to a heater of the second battery based on a comparison of the estimated temperature at the next startup of the engine and the ambient temperature at the next startup of the engine.

In further features, the control module is configured to selectively apply power from only the second battery to the heater when the estimated temperature at the next startup of the engine is greater than the ambient temperature at the next startup of the engine.

In further features, the control module is configured to selectively apply power from both the first battery and the second battery to the heater when the estimated temperature at the next startup of the engine is less than the ambient temperature at the next startup of the engine.

In a feature, a power management method for a vehicle includes: monitoring a first state of charge (SOC) of a first battery of the vehicle, where the first battery has a first nominal voltage; monitoring a second SOC of a second battery of the vehicle, where the second battery has a second nominal voltage that is greater than the first nominal voltage; and, using a direct current (DC) to DC converter, selectively charging the second battery with power from the first battery until the second SOC of the second battery is greater than or equal to a predetermined SOC.

In further features, the power management method further includes selectively applying power to a starter of an engine from the second battery.

In further features, the selectively charging the second battery includes selectively charging the second battery with power from the first battery when the second SOC of the second battery at shutdown of an engine of the vehicle is less than the predetermined SOC.

In further features, the power management method further includes: determining whether to charge the second battery with power from the first battery based on an ambient temperature at shutdown of an engine, where the selectively charging the second battery includes selectively charging the second battery with power from the first battery based on the determination.

In further features, the power management method further includes, prior to a startup of an engine of the vehicle, selectively applying power to a heater of the second battery based on a temperature of the second battery and the SOC of the second battery.

In further features, the selectively applying power to the heater includes, prior to the startup of the engine of the vehicle, applying power to the heater of the second battery when the temperature of the second battery is less than a predetermined temperature.

In further features, the selectively applying power to the heater includes, prior to the startup of the engine of the vehicle, applying power to the heater of the second battery from the first battery when: the temperature of the second battery is less than a predetermined temperature; and the second SOC of the second battery is less than the predetermined SOC.

In further features, the power management method further includes, prior to a startup of an engine of the vehicle, using the DC to DC converter, charging the first battery with power from the second battery when the second SOC of the second battery is greater than a second predetermined SOC.

In further features, the second predetermined SOC is greater than the predetermined SOC.

In further features, the power management method further includes: in response to a shutdown of an engine of the vehicle, determining an estimated temperature at a next startup of the engine; and determining whether to charge the second battery with power from the first battery based on the estimated temperature, where the selectively charging the second battery includes selectively charging the second battery with power from the first battery based on the determination.

In further features, the determining the estimated temperature includes setting the estimated temperature at the next startup of the engine based on an ambient temperature at the shutdown of the engine.

In further features, the determining the estimated temperature includes setting the estimated temperature at the next startup of the engine based on an ambient temperature obtained in response to the shutdown of the engine minus a predetermined temperature.

In further features, the determining the estimated temperature includes determining the estimated temperature at the next startup of the engine based on an average temperature at a location of the vehicle at the next startup of the engine.

In further features, the determining the estimated temperature includes determining the estimated temperature at the next startup of the engine based on a forecast temperature at a location of the vehicle at the next startup of the engine.

In further features, the determining the estimated temperature includes determining the estimated temperature at the next startup of the engine based on a plurality of previous temperatures at previous startups of the engine performed near a location of the vehicle, respectively.

In further features, the determining whether to charge the second battery includes determining to charge the second battery with power from the first battery when, based on the estimated temperature at the next startup of the engine, an estimated value of the second SOC of the second battery at the next startup of the engine is less than the predetermined SOC.

In further features, the power management method further includes: in response to a shutdown of an engine of the vehicle, determining an estimated temperature at a next startup of the engine; determining an ambient temperature at the next startup of the engine; and selectively applying power to a heater of the second battery based on a comparison of the estimated temperature at the next startup of the engine and the ambient temperature at the next startup of the engine.

In further features, the selectively applying power to the heater includes selectively applying power from only the second battery to the heater when the estimated temperature at the next startup of the engine is greater than the ambient temperature at the next startup of the engine.

In further features, the selectively applying power to the heater includes selectively applying power from both the first battery and the second battery to the heater when the estimated temperature at the next startup of the engine is less than the ambient temperature at the next startup of the engine.

In a feature, a power management system for a vehicle includes a first battery monitoring module configured to monitor a first state of charge (SOC) of a first battery of the vehicle. The first battery has a first nominal voltage. A second battery monitoring module is configured to monitor a second SOC of a second battery of the vehicle. The second battery has a second nominal voltage that is greater than the first nominal voltage. A control module is configured to selectively apply power to a heater of the second battery based on an estimated value of the second SOC of the second battery at a next startup of an engine.

In further features, a starter control module is configured to selectively apply power to a starter of the engine from the second battery at the next startup of the engine.

In further features, the control module is configured to apply power to the heater of the second battery when the estimated value of the second SOC of the second battery at the startup of the engine is less than a predetermined SOC.

In further features, the control module is configured to: in response to a shutdown of an engine of the vehicle, determine an estimated temperature at the next startup of the engine; and determine the estimated value of the second SOC of the second battery based on the estimated temperature at the next startup of the engine.

In further features, the control module is configured to set the estimated temperature at the next startup of the engine based on an ambient temperature at the shutdown of the engine.

In further features, the control module is configured to set the estimated temperature at the next startup of the engine based on an ambient temperature obtained in response to the shutdown of the engine minus a predetermined temperature.

In further features, the control module is configured to determine the estimated temperature at the next startup of the engine based on an average temperature at a location of the vehicle at the next startup of the engine.

In further features, the control module is configured to determine the estimated temperature at the next startup of the engine based on a forecast temperature at a location of the vehicle at the next startup of the engine.

In further features, the control module is configured to determine the estimated temperature at the next startup of the engine based on a plurality of previous temperatures at previous startups of the engine performed near a location of the vehicle, respectively.

In further features, the control module is configured to: in response to a shutdown of an engine of the vehicle, determine an estimated temperature at the next startup of the engine; determine an ambient temperature at the next startup of the engine; and selectively apply power to the heater of the second battery based on a comparison of the estimated temperature at the next startup of the engine and the ambient temperature at the next startup of the engine.

In further features, the control module is configured to selectively apply power from only the second battery to the heater when the estimated temperature at the next startup of the engine is greater than the ambient temperature at the next startup of the engine.

In further features, the control module is configured to selectively apply power from both the first battery and the second battery to the heater when the estimated temperature at the next startup of the engine is less than the ambient temperature at the next startup of the engine.

In a feature, a power management method for a vehicle includes: monitoring a first state of charge (SOC) of a first battery of the vehicle, where the first battery has a first nominal voltage; monitoring a second SOC of a second battery of the vehicle, where the second battery has a second nominal voltage that is greater than the first nominal voltage; and selectively applying power to a heater of the second battery based on an estimated value of the second SOC of the second battery at a next startup of an engine.

In further features, the power management method further includes selectively applying power to a starter of the engine from the second battery at the next startup of the engine.

In further features, the selectively applying power to the heater includes applying power to the heater of the second battery when the estimated value of the second SOC of the second battery at the startup of the engine is less than a predetermined SOC.

In further features, the power management method further includes: in response to a shutdown of an engine of the vehicle, determining an estimated temperature at the next startup of the engine; and determining the estimated value of the second SOC of the second battery based on the estimated temperature at the next startup of the engine.

In further features, the determining the estimated temperature includes setting the estimated temperature at the next startup of the engine based on an ambient temperature at the shutdown of the engine.

In further features, the determining the estimated temperature includes setting the estimated temperature at the next startup of the engine based on an ambient temperature obtained in response to the shutdown of the engine minus a predetermined temperature.

In further features, the determining the estimated temperature includes determining the estimated temperature at the next startup of the engine based on an average temperature at a location of the vehicle at the next startup of the engine.

In further features, the determining the estimated temperature includes determining the estimated temperature at the next startup of the engine based on a forecast temperature at a location of the vehicle at the next startup of the engine.

In further features, the determining the estimated temperature includes determining the estimated temperature at the next startup of the engine based on a plurality of previous temperatures at previous startups of the engine performed near a location of the vehicle, respectively.

In further features, the power management method further includes: in response to a shutdown of an engine of the vehicle, determining an estimated temperature at the next startup of the engine; and determining an ambient temperature at the next startup of the engine, where the selectively applying power to the heater includes selectively applying power to the heater of the second battery based on a comparison of the estimated temperature at the next startup of the engine and the ambient temperature at the next startup of the engine.

In further features, the selectively applying power to the heater includes selectively applying power from only the second battery to the heater when the estimated temperature at the next startup of the engine is greater than the ambient temperature at the next startup of the engine.

In further features, the selectively applying power to the heater includes selectively applying power from both the first battery and the second battery to the heater when the estimated temperature at the next startup of the engine is less than the ambient temperature at the next startup of the engine.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure relate to a dual voltage battery system including a first battery and a second battery operating at different voltage levels. For example, the first battery may operate at 12V and the second battery may operate at 48V, although other voltage levels may be used. In some examples, energy from the first battery is selectively moved to the second battery in response to a key off event to allow the second battery to perform heating prior to a key on event and start the engine while maintaining sufficient energy or state of charge (SOC) in the second battery.

In some examples, the first battery supports a first boardnet supplying power to vehicle loads operating at the first voltage level. The second battery supports a second boardnet supplying power to vehicle loads operating at the second voltage level and sufficient energy to start the vehicle in response to key-on and re-start events. Since the only purpose of the first battery in this example is to support the first boardnet (and not start the vehicle), it is not critical to have the first battery operating at 100% state of charge (SOC) during the key-on event since the alternator can be used to charge the first battery after starting.

In other examples, the systems and methods described herein can also be applied to dual voltage battery systems where the first battery is used to support the first boardnet and to start the vehicle during a key-on event. In this case, the systems and methods described herein ensure that the first battery always has sufficient energy or SOC to heat the first battery and to start the vehicle in response to the key-on event. In other words, energy is shuttled from the second battery to the first battery as needed.

In some examples, energy is moved from the first battery to the second battery (or vice versa) as needed to ensure a sufficient amount of energy for heating the second battery (or the first battery) to a predetermined temperature at the next key on.

In some examples, the amount of energy is determined based on information including at least one of battery state of charge (SOC), ambient temperature, global positioning system (GPS) information, time of year (e.g., calendar date), average or current local temperature, and/or time of day. In some examples, the information is used to estimate the amount of energy required to heat the second battery (or the first battery) to a predetermined temperature such as 25° C., start the engine, and remain within an optimal SOC range.

Figure 1A:
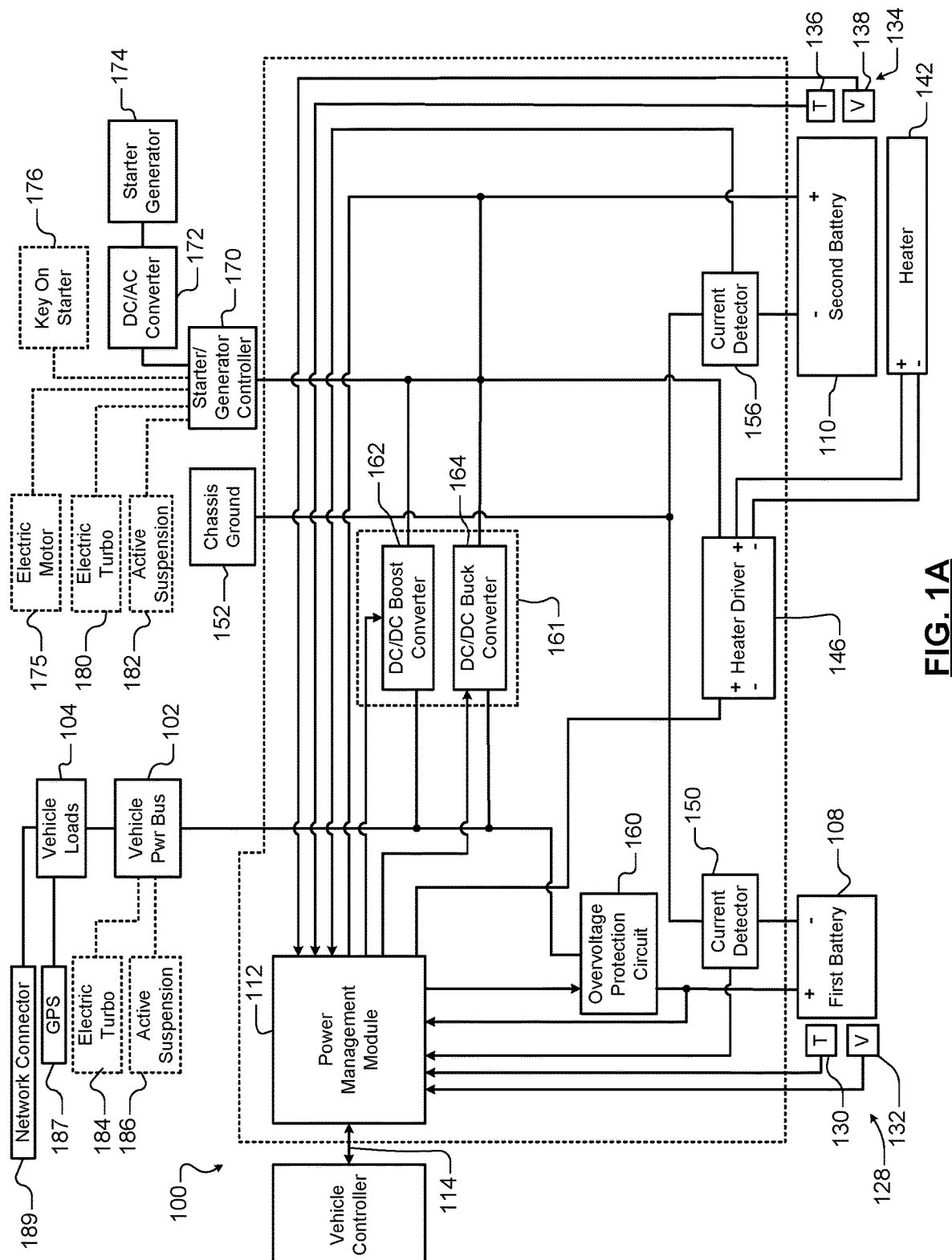
FIG. 1A is a functional block diagram of an example of a power management system for supplying power from a first battery and a second battery operating at different voltages according to the present disclosure.

Referring now to FIG. 1A, a power management system 100 for controlling the supply of power from a first battery 108 and a second battery 110 is shown. While a specific example of the power management system 100 is shown, other architectures can be used. In some examples, the first battery 108 includes a 12V (nominal) battery with multiple battery cells connected in series and/or parallel to positive and negative battery terminals, although other voltage levels can be used. In some examples, the second battery 110 includes a 48V battery with multiple battery cells connected in series and/or parallel to positive and negative battery terminals, although other voltage levels can be used. In some examples, the second battery 110 operates at a higher (nominal) voltage than the first battery 108. In some examples, the second battery 110 operates at 24V, 36V, or 48V nominal (0-54 V), although other voltage levels can be used.

A power management module 112 controls the supply of power from the first battery 108 and the second battery 110. The power management module 112 may communicate over a vehicle data bus 114 with other vehicle controllers and/or with components of the power management system 100. The power management module 112 may transmit data such as state of charge (SOC) and state of health (SOH) for the first battery 108 and the second battery 110 to other vehicle controllers. In some examples, the vehicle data bus 114 includes a CAN bus, although other data bus types can be used. In some examples, the power management module 112 receives information such as key-on events, vehicle speed, drive mode events, engine oil temperature, or other control information from other vehicle controllers. The power management module 112 may adjust operation of the power management system 100 based on these signals.

In some operating modes, the power management module also controls the supply of current to a vehicle power bus 102 and vehicle loads 104 such as boardnet loads. The power management module 112 receives battery operating parameters from one or more sensors 128 such as temperature sensors 130 and/or voltage sensors 132. In some examples, the temperature sensors 130 and the voltage sensors 132 monitor temperatures and voltages at the battery cell level. The power management module 112 also receives operating parameters from sensors 134 such as temperature sensors 136 and/or voltage sensors 138 associated with the second battery 110. In some examples, the temperature sensors 136 and the voltage sensors 138 monitor temperatures and voltages at the battery cell level.

Temperature control of the second battery 110 may be provided by one or more heaters, such as heater 142. The heater(s) may be resistive heaters, thermoelectric devices (TEDs), or another type of heater. A heater driver circuit 146 controls power supplied to the heater(s). The power management module 112 selectively actuates the heater driver circuit 146 as needed to control the temperature of the first battery 108 and/or the second battery 110. In some examples, the heater 142 includes one or more zones that allow individual and independent temperature control of one or more battery cells. The heaters may be located between individual cells of the second battery 110 or may not be located between cells of the second battery 110 but arranged to provide heat to one or more of the cells of the second battery 110.

A current detector circuit 150 detects current supplied by the battery or supplied to the battery during recharging. The current detector circuit 150 may be arranged between a negative terminal of the first battery 108 and chassis ground 152. A current detector circuit 156 detects current supplied by the second battery 110 or supplied to the second battery 110 during recharging. The current detector circuit 156 may be arranged between a negative terminal of the second battery 110 and the chassis ground 152. The current detector circuits 150 and 156 provide sensed battery current and current values, respectively, to the power management module 112.

An overvoltage protection circuit 160 may be arranged between a positive terminal of the first battery 108 and loads such as the vehicle power bus 102. The overvoltage protection circuit 160 monitors a voltage output of the battery and provides a voltage value to the power management module 112. The overvoltage protection circuit 160 protects the battery from overcharging when one or more cells are at or above a voltage limit of the battery cell. Another function of the overvoltage protection circuit 160 is to protect the battery from excessive current. If an over voltage condition is detected, the first battery 108 may be disconnected or other actions may be taken.

In some examples, the power management module 112 performs battery management including cell voltage measurement, cell balancing, temperature measurement, current limits calculations, state of charge (SOC) estimation and/or state of health (SOH) estimation based on the measured battery parameters.

A DC/DC converter 161 may be provided to control flow of the current between the first battery 108, the second battery 110 and/or a starter/generator 174. In some examples, the DC/DC converter 161 includes a DC/DC boost converter 162 and a DC/DC buck converter 164 that are connected between the first battery 108, the second battery 110 and the starter/generator 174. In some examples, the DC/DC boost converter 162 has an input range of 8V to 16V and a current input range of 0-100 Amps. In some examples, the DC/DC boost converter 162 has an output range of 24V to 54V and a current output range of 0-67 Amps.

In some examples, the DC/DC buck converter 164 has an input range of 24V to 54V and a current input range of 0-53 Amps. In some examples, the DC/DC buck converter 164 has an output range of 8V to 16V and a current output range of 0-80 Amps. As can be appreciated, the ratings of the DC/DC boost converter 162 and the DC/DC buck converter 164 will vary for different applications.

A starter/generator controller (a starter control module) 170 is connected to the DC/DC boost converter 162, the DC/DC buck converter 164, and the second battery 110. The starter/generator controller 170 is also connected to a DC/AC converter 172, which is connected to the starter/generator 174. The starter/generator 174 is connected to an engine (not shown). In some examples, one or more electric motors 175 for driving the wheels may be provided.

The vehicle power bus 102 may also be connected to an electric turbo 184 and/or an active suspension system 186, which operate at the voltage of the first battery 108. Alternately, an electric turbo 180 and/or an active suspension system 182 may be connected to the starter/generator controller 170 or the AC/DC converter if they operate at higher voltages such as 24V, 36V, 48V, etc.

In some examples, a key-on starter 176 may be connected to the starter/generator controller 170 and may be provided for starting larger displacement engines requiring higher starting current. The key-on starter 176 may be supplied by current from the second battery 110 and assisted in a limited and controlled manner by current supplied by the first battery 108 as described above.

In some examples, a global positioning system (GPS) 187 may be used to determine the location of the vehicle. A network connector 189 provides a wireless connection to a network such as the Internet. In some examples, the network connector 189 includes a cellular transceiver, a satellite transceiver or other transceiver.

Figure 1B:
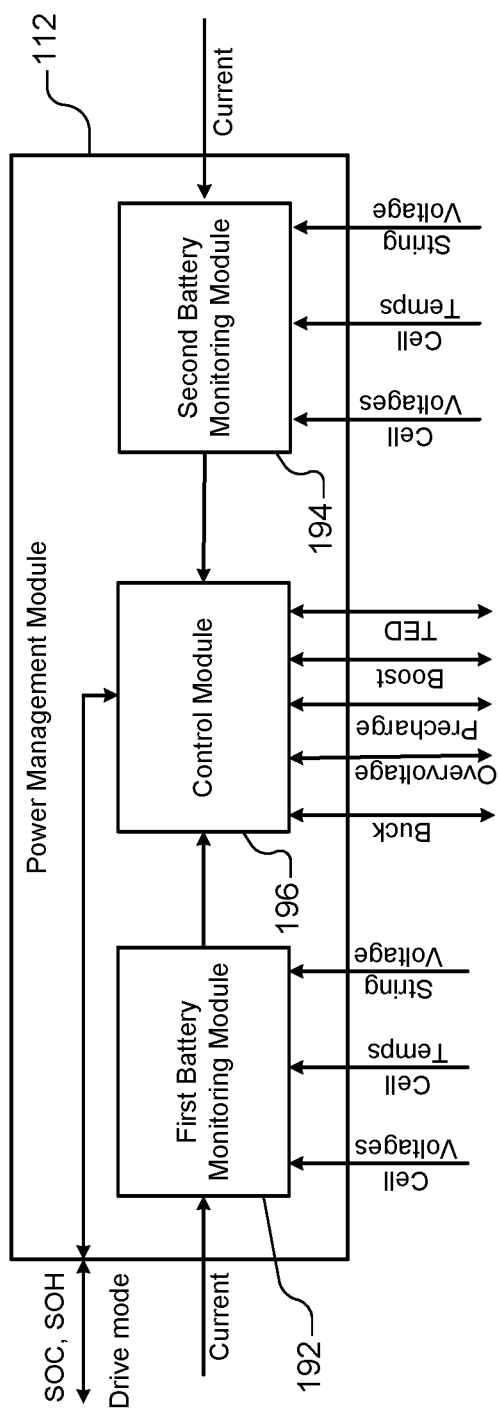
FIG. 1B is a more detailed functional block diagram of an example of a power management module in FIG. 1A according to the present disclosure.

Referring now to FIG. 1B, an example of the power management module 112 is shown in further detail. The power management module 112 includes a first battery monitoring module 192, a second battery monitoring module 194 and a control module 196. The first battery monitoring module 192 receives cell voltages, battery current, cell temperatures and/or string voltage as described above in FIG. 1A. The battery monitoring module 192 performs cell balancing, calculates state of charge (SOC) and/or state of health (SOH) values for the first battery 108. The second battery monitoring module 194 also receives cell voltages, current, cell temperatures and/or string voltage as described above in FIG. 1A. The second battery monitoring module performs cell balancing, calculates SOC and/or calculates SOH for the second battery 110.

The control module 196 communicates with the first battery monitoring module 192 and the second battery monitoring module 194. The control module 196 may also receive information such as key-on events, key-off events, vehicle speed, engine oil temperature, drive mode events, regeneration events, e-boost events or other control information from other vehicle controllers via the vehicle data bus 114. Key-on events include engine startups responsive to user input for an ignition system (e.g., via an ignition key, button, or switch) and automatic engine startups. Key-on events also include expected engine startups. The control module 196 may identify an expected engine startup, for example, when an occupant enters the vehicle, when an occupant sits on a driver seat of the vehicle, when a remote entry or start signal is received (e.g., from a key fob or a wireless device, such as cell phone or tablet), or when a device (e.g., key fob or wireless device) is detected within a predetermined distance of the vehicle. The control module 196 may detect an occupant entry of the vehicle, for example, when a driver's door of the vehicle transitions from closed to open, as indicated by a door sensor. The control module 196 may detect an occupant sitting on the driver seat of the vehicle, for example, based on a signal from a seat occupancy sensor of the driver seat of the vehicle. Key-off events include engine shutdowns responsive to user input for the ignition system (e.g., via the ignition key, button, or switch) and automatic engine shutdowns. The control module 196 may also share SOC and SOH values for the first battery 108 and the second battery 110 with other vehicle controllers via the vehicle data bus 114.

The control module 196 enables and disables the DC/DC converter 161. For example, the control module enables and disables the DC/DC buck converter 164 and the DC/DC boost converter 162 as needed during the various operating modes. The control module 196 also monitors operation of the overvoltage protection circuit 160. The control module 196 also communicates with the heater driver circuit 146 to control heating/cooling of zones in the heater 142 associated with the first battery 108 and the second battery 110.

Figure 2:
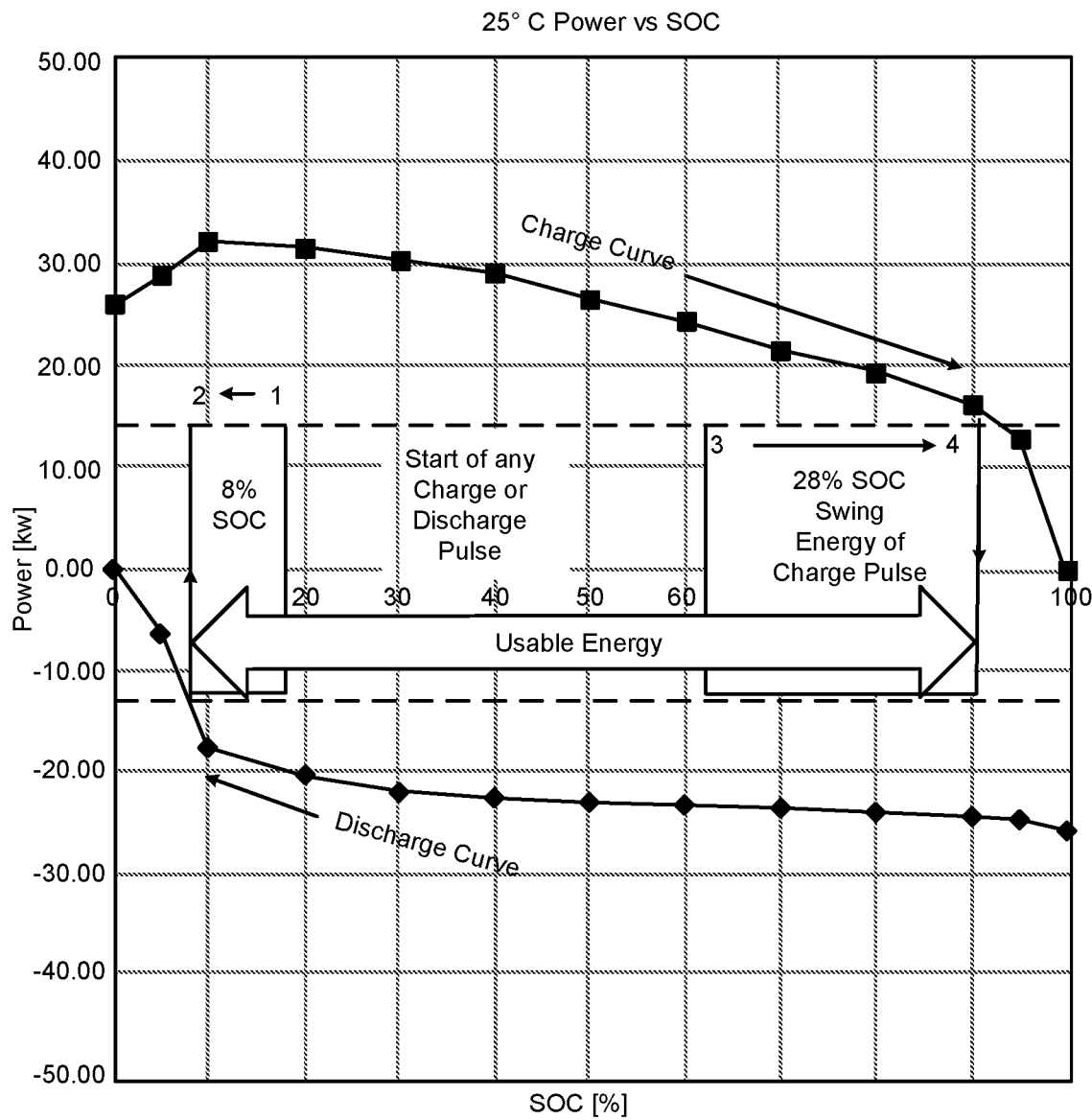
FIGS. 2 and 3 are graphs showing power as a function of state of charge (SOC) at first and second temperatures (25° C. and 0° C., respectively) according to the present disclosure.
Figure 3:
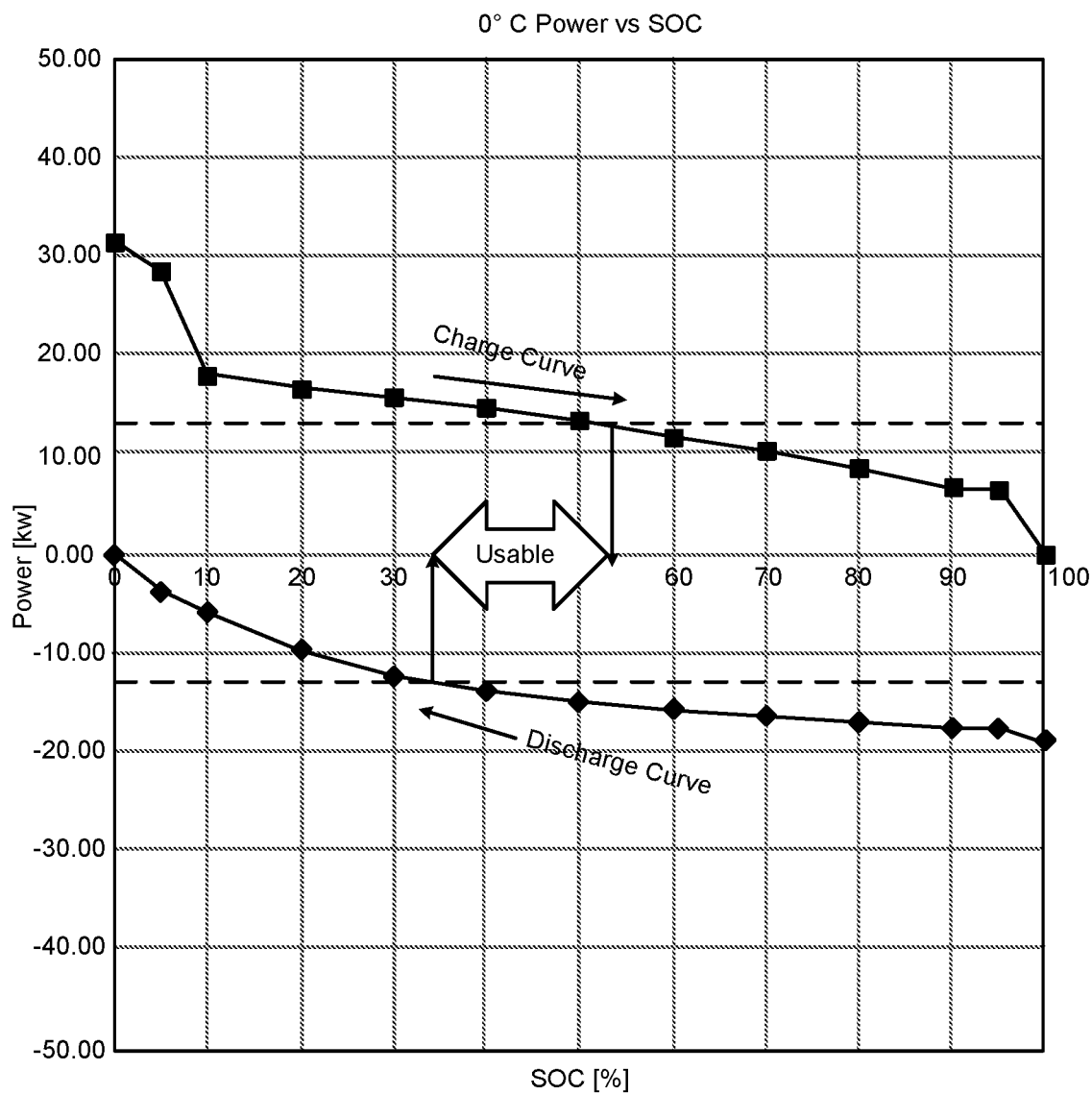

Referring now to FIGS. 2 and 3, usable energy is shown at 25° C. and 0° C., respectively. Internal resistance of the battery cells increases at lower temperatures and therefore a charge curve moves down and a discharge curve moves up (both corresponding to lower power). Dashed lines in this example correspond to required charge and discharge power specifications that will vary depending upon a particular application. Useable energy is defined by intersections of the charge and discharge curves and the dashed lines. As can be appreciated, the second battery has more useable energy at 25° C. as compared to lower temperatures such as 0° C. or −25° C.

Usable energy is defined as an amount of energy between points 2 and 4 in FIG. 2. Point 2 is defined as a lowest SOC at which the specified max discharge power can occur without falling below the minimum specified pack or cell voltage. Point 4 is defined as the highest SOC at which the max specified discharge power can occur without exceeding the maximum specified pack or cell voltage.

In FIG. 2, point 1 is defined as the lowest SOC at which max specified discharge power pulse can begin while achieving the full specified duration (width of pulse from 1-2). Point 3 is defined as the highest SOC at which max specified charge power pulse can begin while achieving the full specified duration (width of pulse 3-4).

Figure 4:
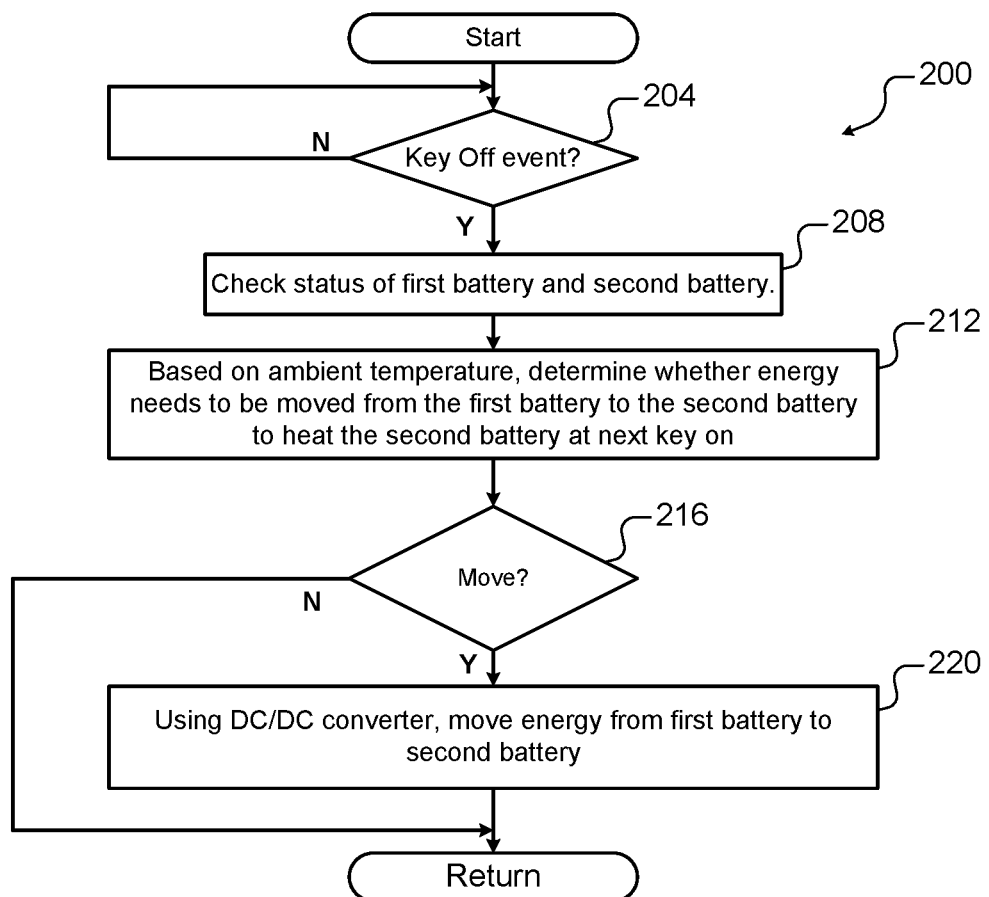
FIG. 4 is a flowchart illustrating an example of a method for moving energy from the first battery to the second battery in response to a key off event based upon ambient temperature according to the present disclosure.

Referring now to FIG. 4, a method 200 estimates energy (e.g., SOC of the second battery) that will be required to heat the engine and start the engine using the second battery based on the ambient temperature at the key off event. At 204, when a key off event occurs, the method continues at 208 and checks the status of the first battery and the second battery. At 212, based on the ambient temperature, the method determines whether energy needs to be moved from the first battery to the second battery (to heat the second battery for the next key on event and to start the engine while staying within a predetermined SOC range). For example, the method may determine an estimated SOC of the second battery at the next key on event based on the estimated temperature and determine whether energy needs to be moved from the first battery to the second battery based on whether the estimated SOC of the second battery is within the predetermined SOC range. The method may determine to move energy from the second battery to the first battery, for example, when the estimated SOC is less than a lower (SOC) limit of the predetermined SOC range. If energy needs to be moved as determined at 216, the method uses the DC/DC converter 161 to move the energy from the first battery to the second battery at 220.

Figure 5:
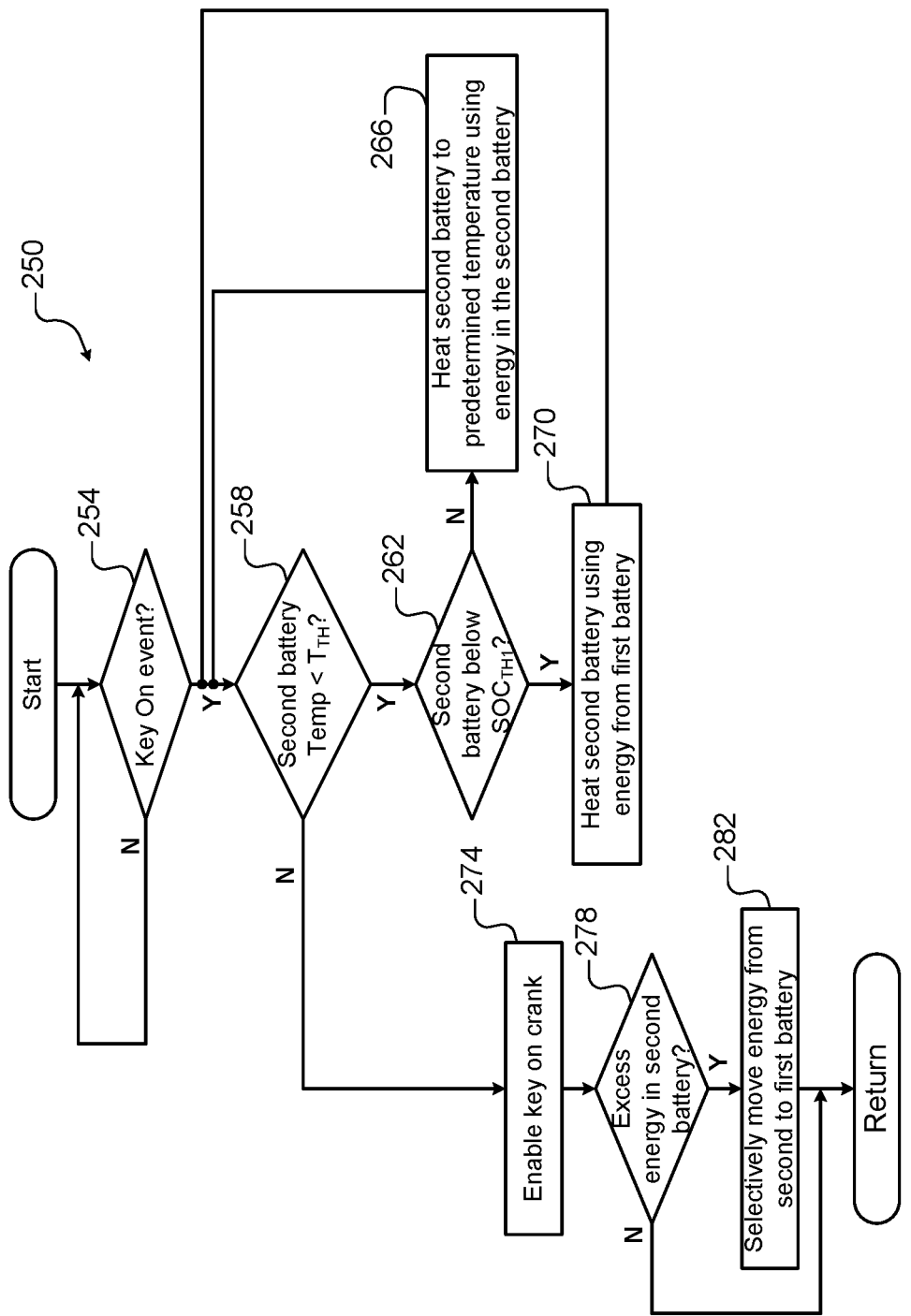
FIG. 5 is a flowchart illustrating an example of a method for controlling energy in the first battery and the second battery after a key on event according to the present disclosure.

Referring now to FIG. 5, a method for heating the second battery in response to a key on event is shown at 250. At 254, the method determines whether a key on event occurs. When 254 is true, the method determines whether the second battery temperature is less than a predetermined temperature threshold at 258. When 258 is true, the method continues at 262 and determines whether the SOC of the second battery is below a predetermined state of charge $SOC_{TH}$. When 262 is false, the second battery is heated to a predetermined temperature using energy from the second battery at 266. When 262 is true, the second battery is heated using energy from the first battery at 270.

When the temperature of the battery is greater than the predetermined temperature threshold as determined at 258, key on crank is enabled at 274. In some examples, the method may also check to determine whether there is excess energy in the second battery after cranking at 278. In some examples, excess energy may be present if the SOC of the second battery is greater than point 3. If 278 is true, energy is moved from the second battery to the first battery at 282. Otherwise when 278 is false, the method ends.

In some examples, the power management module 112 anticipates the temperature of the second battery for the next key-on event. The anticipated temperature is used to calculate the amount of energy required to heat the second battery from the current battery temperature to a predetermined temperature (for example 25° C.) during the next key-on event with the second battery having a SOC ending between points 1 and 3. In this manner, the useable energy of the second system is not diminished by the heating process.

The energy used from the first battery is not critical to operation of the vehicle at key-on start and can be replenished by an alternator once the vehicle is started. In this manner, the second battery can be maintained between points 1 and 3 after key-on and heating is completed.

In some examples, the estimated ambient temperature at the next key on event can be estimated by subtracting a predetermined temperature (for example 10° C. or another value) from the outside ambient temperature at key-off, calculating the amount of energy required to heat the battery to optimal temperature (say 25° C.) and moving that amount of energy from the first battery to the second battery.

Figure 6:
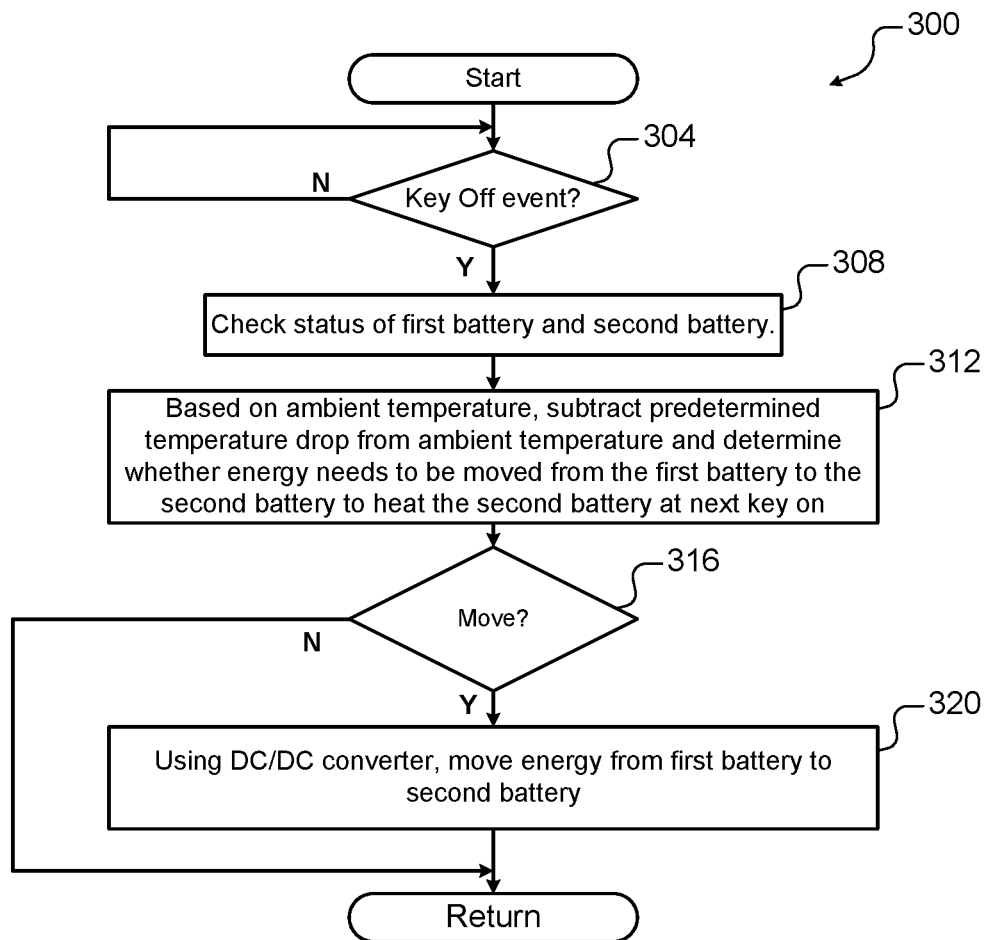
FIG. 6 is a flowchart illustrating an example of a method for moving energy from the first battery to the second battery based upon ambient temperature minus a predetermined temperature drop according to the present disclosure.

Referring now to FIG. 6, a method 300 estimates energy that will be required to heat the engine and start the engine using the second battery based on an estimated ambient temperature for the next key on event. At 304, when a key off event occurs, the method continues at 308 and checks the status of the first battery and the second battery. At 312, based on the ambient temperature, the method subtracts a predetermined temperature from the ambient temperature. The method determines whether energy needs to be moved from the first battery to the second battery to heat the second battery during the next key on event and to start the engine while staying within a predetermined SOC range based on the estimated temperature at 316. If energy needs to be moved as determined at 316, the method uses the DC/DC converter 161 to move the energy from the first battery to the second battery at 320.

Figure 7:
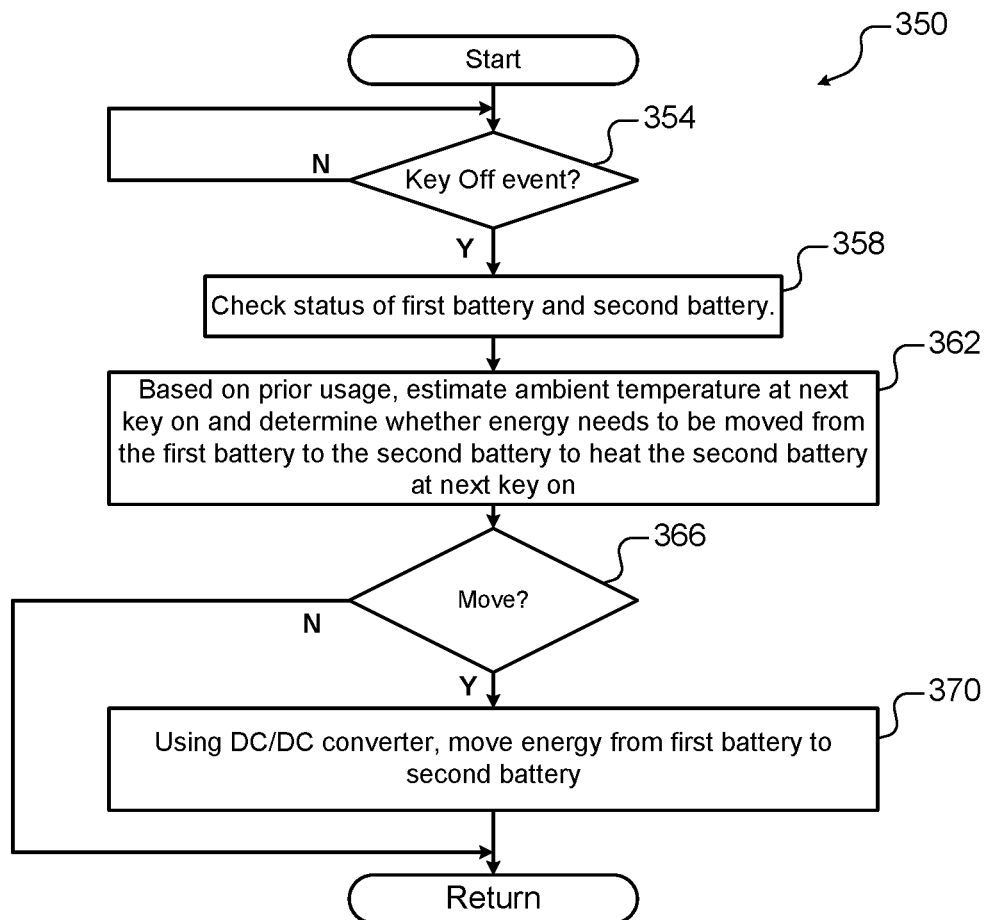
FIG. 7 is a flowchart illustrating an example of a method for moving energy from the first battery to the second battery based upon ambient temperature at the next key on (estimated based on prior usage) according to the present disclosure.

Referring now to FIG. 7, a method 350 estimates energy that will be required to heat the engine and start the engine using the second battery by estimating ambient temperature for the next key on event at least in part based on prior usage data. At 354, when a key off event occurs, the method continues at 358 and checks the status of the first battery and the second battery. At 362, based on the prior usage of the vehicle, the method estimates the ambient temperature for the next key on.

For example, during the weekdays, the vehicle is typically keyed off at night at various times and started at approximately 8 AM the next day. When the vehicle is keyed off on Tuesday night, the prior usage data may indicate that the vehicle would be started at 8 AM on Wednesday morning. The system estimates the temperature to be 10° C. at 8 AM on Wednesday (either based on weather forecast or average seasonal temperatures at or near the GPS or geographic location of the vehicle) and moves energy from the first battery to the second battery as needed.

The method determines whether energy needs to be moved from the first battery to the second battery to heat the second battery during the next key on event and to start the engine while staying within a predetermined SOC range based on the estimated temperature at 366. If energy needs to be moved as determined at 366, the method uses the DC/DC converter 161 to move the energy from the first battery to the second battery at 370.

Figure 8:
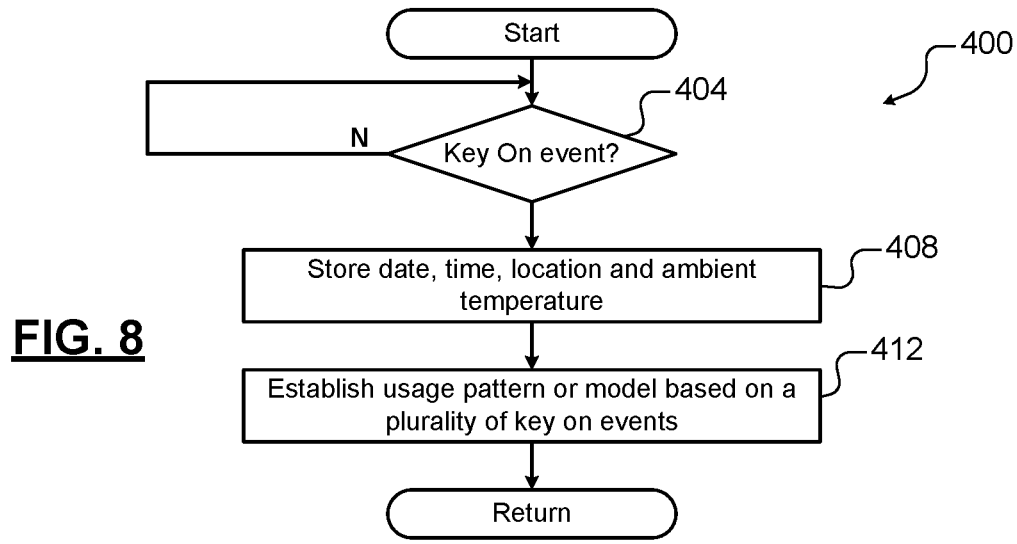
FIG. 8 is a flowchart illustrating an example of a method for creating a usage pattern or model for the vehicle based on information stored after a plurality of key on events according to the present disclosure.
Figure 9:
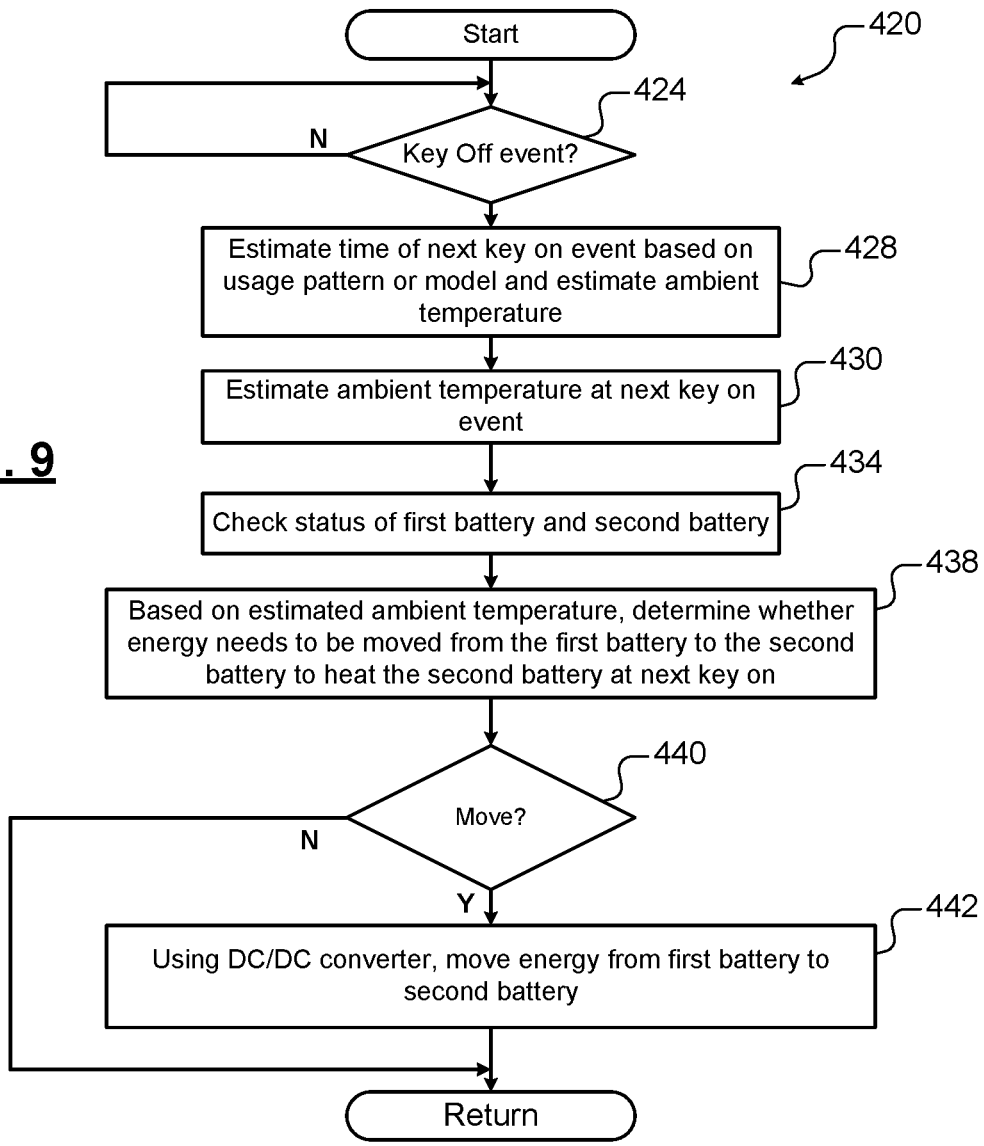
FIG. 9 is a flowchart illustrating an example of a method for estimating ambient temperature during a next key on event based upon the usage pattern or model according to the present disclosure.

Referring now to FIGS. 8 and 9, more sophisticated methods for determining the estimated ambient temperature at the next key on event can be used. For example, in FIG. 8, a method 400 determines whether a key on event occurs at 404. If 404 is true, the date, time, location and ambient temperature are stored at 408. At 412, a usage pattern or model is created based upon a plurality of key on events.

In FIG. 9, a method 420 uses the usage pattern or model to predict the ambient temperature during the next key on event. At 424, the method determines whether a key off event has occurred. At 428 and 430, the time of the next key on event and the ambient temperature at the next key on event are estimated based upon the usage pattern or model. At 434, the method checks the status of the first battery and the second battery. At 438, the method determines whether energy needs to be moved from the first battery to the second battery to heat the second battery at the next key on event based on the estimated time and ambient temperature determined using the usage pattern or model. If energy needs to be moved as determined at 440, energy is moved from the first battery to the second battery using the DC/DC converter at 442.

Energy that is transferred to the second battery is used to heat the second battery after key-on. In some examples, if the energy estimate is too low, the first battery participates in heating the second battery by shuttling energy from the first battery to the second battery after key-on (during heating). The energy is moved in a controlled manner though the DC/DC converter to ensure the first boardnet voltage does not drop below the minimum specification. If the energy estimate is too high, some energy is shuttled back from the second battery to the first battery after key-on. In this manner, the second battery always ends up in the optimal SOC zone (between points 1 and 3) after heating of the second battery is completed.

Figure 10:
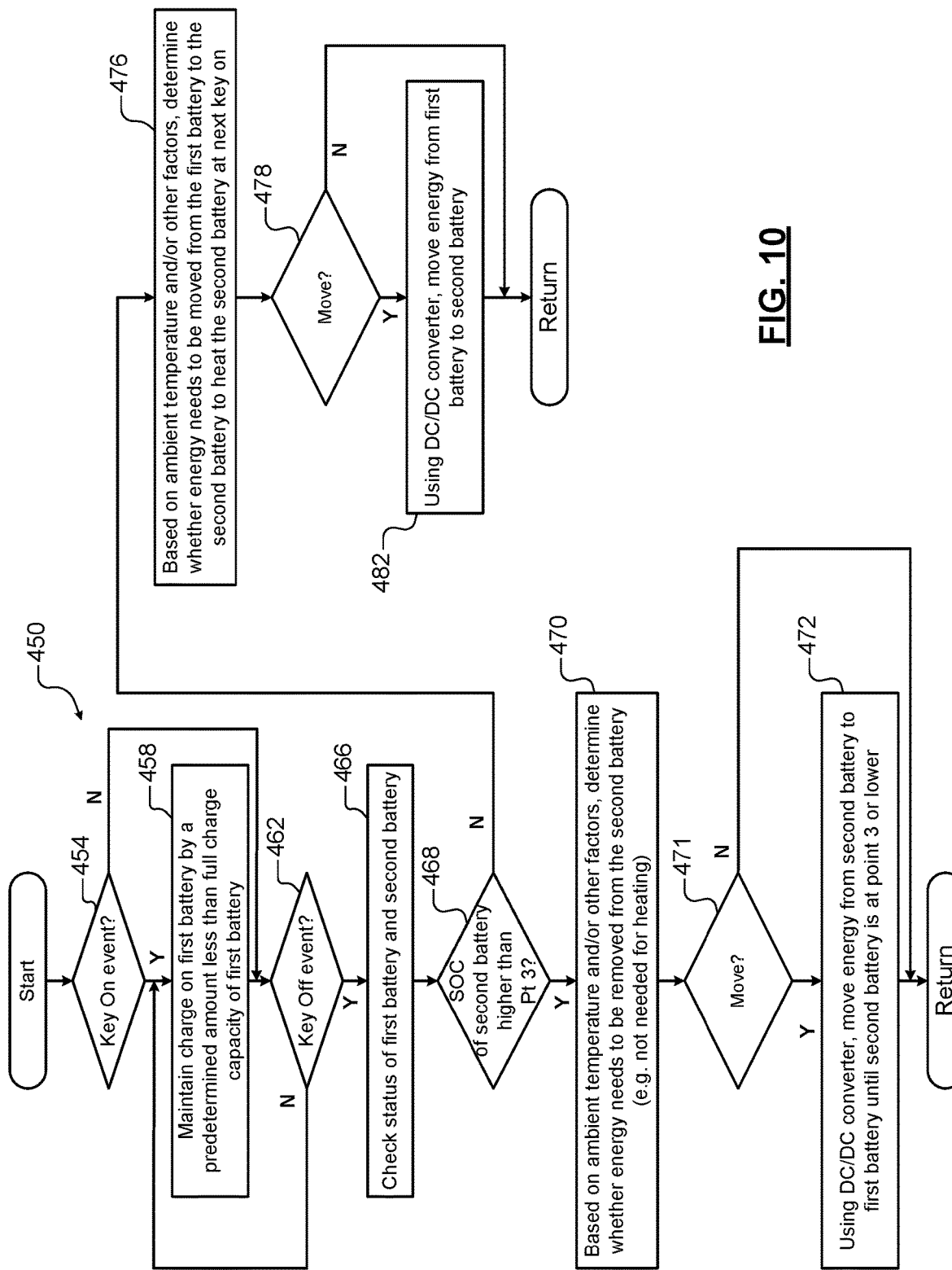
FIGS. 10 and 11 are flowchart illustrating examples of methods for moving energy based on the SOC of the second battery according to the present disclosure.

Referring now to FIG. 10, a method 450 uses energy from the first battery during heating if needed or stores excess energy from the second battery if it is not needed for heating at the next key on. If a key on event occurs at 454, the method maintains charge on the first battery by a predetermined amount less than a full charge capacity of the first battery at 458. When a key off event occurs as determined at 462, the method checks the status of the first battery and the second battery at 466. At 468, the method determines whether the state of charge of the second battery is higher than point 3. If 468 is true, the method determines whether energy needs to be removed from the second battery (for example the energy is not needed for heating) at 470. If energy needs to be moved as determined at 471, the method uses the DC/DC converter 161 to move energy from the second battery to the first battery at 472.

If 468 is false, the method determines whether energy needs to be moved from the first battery to the second battery to heat the second battery at the next key on event at 476. If energy needs to be moved as determined at 478, the method uses a DC/DC converter to move energy from the first battery to the second battery at 482.

In another example, energy is moved from the first battery to the second battery at key off if the SOC of the second battery is below point 3 in order to bring the second battery to or near point 3 for the given battery temperature or the anticipated battery temperature. In this way, the second battery is always ready for a key-on start or a key-on heating or cooling event.

In some examples, the usage pattern and/or model may use additional information such as GPS data (geographic location), historical or current climate data for that geographic location, date (time of year), time of day and other parameters to estimate the most likely outside ambient temperature at the next key on.

In some examples, the control system monitors the outside ambient temperature after key off to determine if the vehicle is parked in a protected area (such as a garage) and shuttles the energy accordingly. In other examples, the control system learns the driving habits (time after key off before next key on for a given time of day, for example) and uses this information to anticipate the time and outside temperature for the next key on. For example, if a driver parks the vehicle at between 7 am and 8 am, it is usually parked outside for 9 hours. If the driver parks the car after 9 pm, it usually stays in a garage where it is warmer for 9 hours.

In some examples, the second battery is heated without diminishing the specified usable energy of the second battery. This can be done by utilizing energy in the first battery which is not critical for full functionality at key on start and is easily replenished by the alternator after key on start. In FIG. 10, if key-off occurs when the SOC is higher than point 3, the energy is dissipated from the second battery so that the second battery is in the optimal SOC zone after the next key-on event. This energy is available for heating of the second battery. If the second battery does not need to be heated, the excess energy is moved to the first battery.

Storage for the energy can be ensured by upsizing the first battery and charging the battery to a level less than the capacity of the battery. In a first example, the first battery is upsized from a first capacity (such as 40-80 Ah) by an additional capacity (such as 5-20 Ah). For example, the first battery with a capacity of 60 Ah can be replaced by a battery having a capacity of 75 Ah to allow heating of the battery from −25 C to 25 C, which requires 14.3 Ah. The additional capacity can correspond to the amount of heating energy required for the second battery. During operation, the first battery is charged to the total capacity less the additional capacity. This ensures the first battery is always ready to receive the additional capacity from the second battery.

In a second example, the first battery is upsized with additional capacity based on the amount of energy between points 3 and 4. The first battery is charged to the total capacity less the additional capacity. This ensures the first battery is always ready to receive the energy of a full charge pulse (energy between points 3 and 4) from the second battery. This also ensures the second battery will always be able to receive a full charge pulse after the next key-on.

Figure 11:
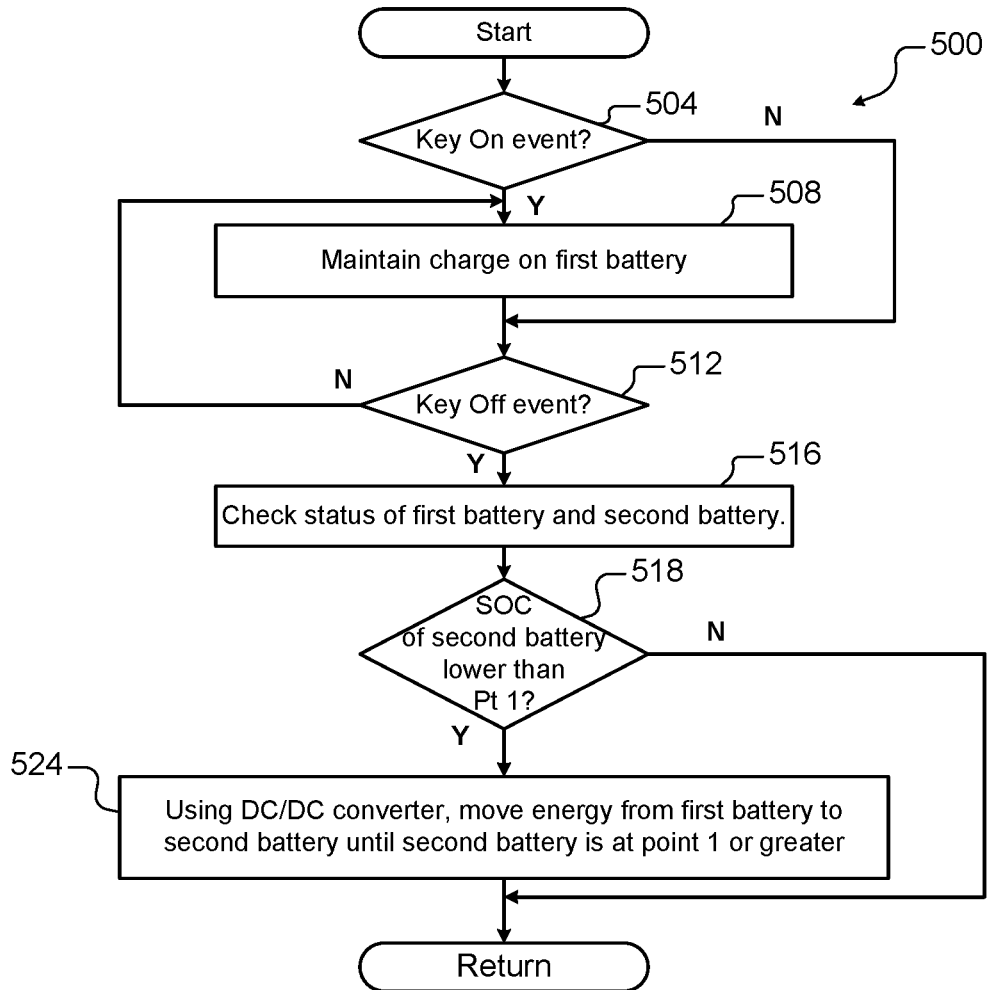

Referring now to FIG. 11, a method 500 for moving energy from the first battery to the second battery based on the SOC of the second battery is shown. The method determines whether a key on event occurs at 504. At 508, the method maintains charge on the first battery during operation. In some examples, the charges maintained at the total capacity less the additional capacity At 512, the method determines whether a key off event occurs. If 512 is true, the method checks the status of the first battery and the second battery at 516. At 518, the method determines whether the SOC of second battery is lower than point 1. If 518 is true, the method moves energy from the first battery to the second battery until the second battery is at point 1 or a greater SOC at 524.

If the SOC is below point 1, energy is shuttled from the first battery to the second battery until the second battery is at point 1 or greater SOC. In this manner, a max discharge power pulse can occur after the next key on event for the full specified duration (width of pulse from 1-2) without hitting the minimum specified pack or cell voltage (usable energy). Since the first battery does not perform key-on start, it does not need to be at full SOC at key-on. For the examples described above, the capacity of the first battery falls below the total capacity less the additional capacity (e.g. 60 Ah) after key-off. The alternator would charge the first battery back to 60 Ah after key-on.

Likewise, if the SOC is above point 3, energy is moved from the second battery to the first battery until the second battery is at point 3 or lower SOC. In this manner, a max charge power pulse can occur after key on for the full specified duration (width of pulse from 3-4) without hitting the maximum specified pack or cell voltage (usable energy). For the examples described above, the capacity of the first battery is increased above the total capacity less the additional capacity (e.g. above 60 Ah) after key-off. If the SOC of the second battery was at point 4 at key-off, the first battery capacity is increased from 60 Ah to the amount of energy between points 3 and 4 after key-off. This would ensure the second battery will always be able to receive a full charge pulse after the next key-on.

Figure 12:
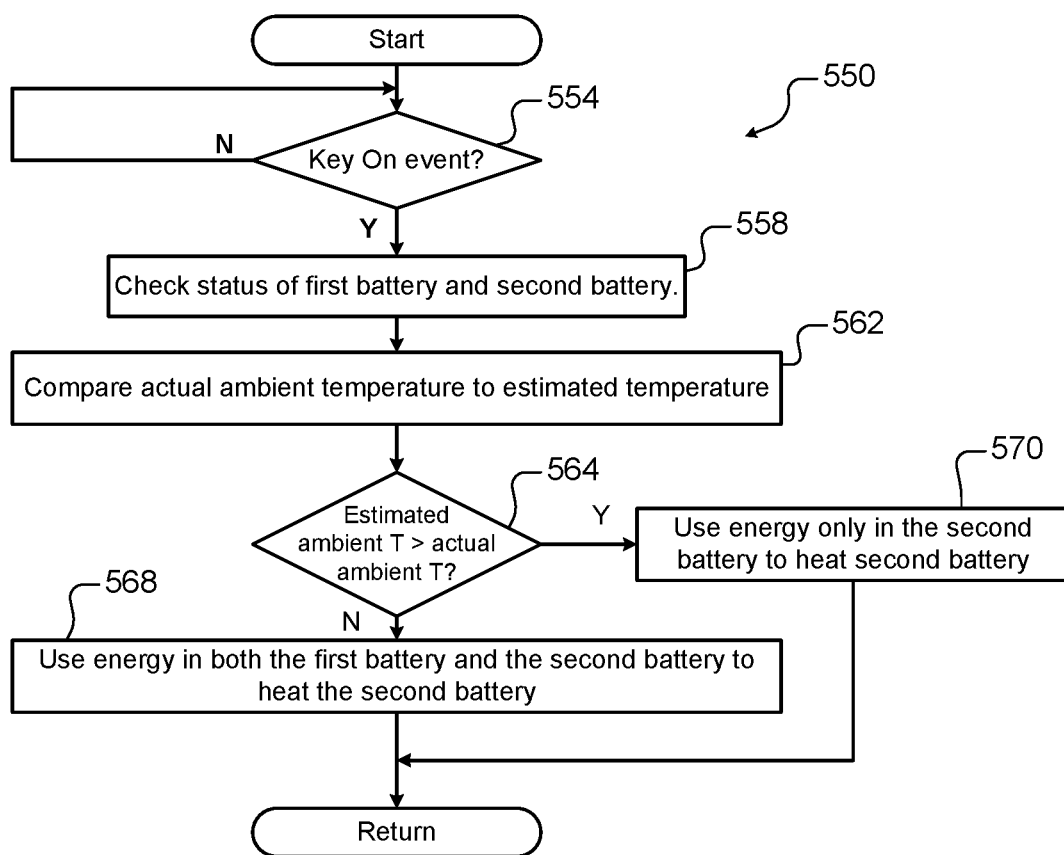
FIG. 12 is a flowchart illustrating a method for moving energy between the first battery and the second battery based on a comparison of the actual ambient temperature during the key on event and the estimated ambient temperature according to the present disclosure.

Referring now to FIG. 12, a method 550 compares the estimated ambient temperature for the next key on event (determined at the last key off event) to the actual ambient temperature when the key on event occurs. The method selectively uses the energy in the first battery and/or the second battery to heat the second battery depending upon the comparison. At 554, the method determines whether a key on event occurs. If 554 is true, the method checks the status of the first battery and the second battery and other conditions such as the actual ambient temperature at 558.

At 562, the method compares the actual ambient temperature to the estimated ambient temperature (previously estimated at the last key off event). If the estimated ambient temperature is greater than or equal to the actual ambient temperature, then the energy in the second battery is sufficient to heat the second battery. If the estimated ambient temperature is less than the actual ambient temperature, then the energy in the second battery is supplemented by the energy in the first battery to heat the second battery. In other words, additional heating is required.

If 564 is true, the method continues at 570 and energy in the second battery is used to heat the second battery. If 564 is false, the method continues at 568 and uses energy in both the first battery and the second battery to heat the second battery.

The systems and methods described herein allow the first battery to assist during heating after key-on if the estimated temperature at key-on was too high (energy for heating was too low). However, since most of the heating energy was transferred just after key off, the load and subsequent voltage drop of the first battery during start will be minimal, which protects the stability of the first boardnet. The transfer of energy is performed in a controlled manner though the DC/DC converter to ensure the first boardnet voltage does not drop below the minimum specification. The first battery may be oversized in capacity by the amount of heating energy required for the second battery.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

What is claimed is:

1. A power management system for a vehicle, comprising:
a first battery monitoring module configured to monitor a first state of charge (SOC) of a first battery of the vehicle,
wherein the first battery has a first nominal voltage;
a second battery monitoring module configured to monitor a second SOC of a second battery of the vehicle,
wherein the second battery has a second nominal voltage that is greater than the first nominal voltage; and
a control module configured to, while an engine is off before a next startup of the engine, selectively apply power to a heater of the second battery from the first battery based on an estimated SOC of the second battery at the next startup of the engine determined based on a temperature when the engine was shut off.

2. The power management system of claim 1 further comprising a starter control module configured to selectively apply power to a starter of the engine from the second battery t the next startup of the engine.

3. The power management system of claim 1 wherein the control module is configured to apply power to the heater of the second battery when the estimated SOC of the second battery at the next startup of the engine is less than a predetermined SOC.

4. The power management system of claim 1 wherein the control module is configured to:
in response to a shutdown of an engine of the vehicle, determine an estimated temperature at the next startup of the engine; and
determine the estimated SOC of the second battery based on the estimated temperature at the next startup of the engine.

5. The power management system of claim 4 wherein the control module is configured to set the estimated temperature at the next startup of the engine based on an ambient temperature at the shutdown of the engine.

6. The power management system of claim 4 wherein the control module is configured to set the estimated temperature at the next startup of the engine based on an ambient temperature obtained in response to the shutdown of the engine minus a predetermined temperature.

7. The power management system of claim 4 wherein the control module is configured to determine the estimated temperature at the next startup of the engine based on an average temperature at a location of the vehicle at the next startup of the engine.

8. The power management system of claim 4 wherein the control module is configured to determine the estimated temperature at the next startup of the engine based on a forecast temperature at a location of the vehicle at the next startup of the engine.

9. The power management system of claim 4 wherein the control module is configured to determine the estimated temperature at the next startup of the engine based on a plurality of previous temperatures at previous startups of the engine performed near a location of the vehicle, respectively.

10. The power management system of claim 1 wherein the control module is configured to:
in response to a shutdown of an engine of the vehicle, determine an estimated temperature at the next startup of the engine;
determine an ambient temperature at the next startup of the engine; and
selectively apply power to the heater of the second battery based on a comparison of the estimated temperature at the next startup of the engine and the ambient temperature at the next startup of the engine.

11. The power management system of claim 10 wherein the control module is configured to selectively apply power from only the second battery to the heater when the estimated temperature at the next startup of the engine is greater than the ambient temperature at the next startup of the engine.

12. The power management system of claim 10 wherein the control module is configured to selectively apply power from both the first battery and the second battery to the heater when the estimated temperature at the next startup of the engine is less than the ambient temperature at the next startup of the engine.

13. A power management method for a vehicle, comprising:
monitoring a first state of charge (SOC) of a first battery of the vehicle,
wherein the first battery has a first nominal voltage;
monitoring a second SOC of a second battery of the vehicle,
wherein the second battery has a second nominal voltage that is greater than the first nominal voltage; and
while an engine is off before a next startup of the engine, selectively applying power to a heater of the second battery from the first battery based on an estimated SOC of the second battery at the next startup of the engine determined based on a temperature when the engine was shut off.

14. The power management method of claim 13 further comprising selectively applying power to a starter of the engine from the second battery at the next startup of the engine.

15. The power management method of claim 13 wherein the selectively applying power to the heater includes applying power to the heater of the second battery when the estimated SOC of the second battery at the next startup of the engine is less than a predetermined SOC.

16. The power management method of claim 13 further comprising:
in response to a shutdown of an engine of the vehicle, determining an estimated temperature at the next startup of the engine; and
determining the estimated SOC of the second battery based on the estimated temperature at the next startup of the engine.

17. The power management method of claim 16 wherein the determining the estimated temperature includes setting the estimated temperature at the next startup of the engine based on an ambient temperature at the shutdown of the engine.

18. The power management method of claim 16 wherein the determining the estimated temperature includes setting the estimated temperature at the next startup of the engine based on an ambient temperature obtained in response to the shutdown of the engine minus a predetermined temperature.

19. The power management method of claim 16 wherein the determining the estimated temperature includes determining the estimated temperature at the next startup of the engine based on an average temperature at a location of the vehicle at the next startup of the engine.

20. The power management method of claim 16 wherein the determining the estimated temperature includes determining the estimated temperature at the next startup of the engine based on a forecast temperature at a location of the vehicle at the next startup of the engine.

21. The power management method of claim 16 wherein the determining the estimated temperature includes determining the estimated temperature at the next startup of the engine based on a plurality of previous temperatures at previous startups of the engine performed near a location of the vehicle, respectively.

22. The power management method of claim 13 further comprising:
in response to a shutdown of an engine of the vehicle, determining an estimated temperature at the next startup of the engine; and
determining an ambient temperature at the next startup of the engine,
wherein the selectively applying power to the heater includes selectively applying power to the heater of the second battery based on a comparison of the estimated temperature at the next startup of the engine and the ambient temperature at the next startup of the engine.

23. The power management method of claim 22 wherein the selectively applying power to the heater includes selectively applying power from only the second battery to the heater when the estimated temperature at the next startup of the engine is greater than the ambient temperature at the next startup of the engine.

24. The power management method of claim 22 wherein the selectively applying power to the heater includes selectively applying power from both the first battery and the second battery to the heater when the estimated temperature at the next startup of the engine is less than the ambient temperature at the next startup of the engine.

* * * * *